(12) United States Patent
Ying et al.

(10) Patent No.: US 9,881,664 B1
(45) Date of Patent: Jan. 30, 2018

(54) PER-GROUP DELAY LINE ARCHITECTURE TO DE-SKEW INPUT/OUTPUT TIMING BETWEEN A HIGH BANDWIDTH MEMORY (HBM) PHYSICAL (PHY) INTERFACE AND THE HBM DEVICE

(71) Applicant: Cadence Design Systems, Inc., San Jose, CA (US)

(72) Inventors: Guangxi Ying, Beijing (CN); Yanjuan Zhan, Beijing (CN); Zhehong Qian, Shanghai (CN); Ying Li, Shanghai (CN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/404,901

(22) Filed: Jan. 12, 2017

(51) Int. Cl.
*G11C 11/4093* (2006.01)
*G11C 11/4076* (2006.01)
*G11C 11/4096* (2006.01)
*G06F 1/10* (2006.01)
*G11C 7/22* (2006.01)

(52) U.S. Cl.
CPC .......... *G11C 11/4093* (2013.01); *G06F 1/10* (2013.01); *G11C 7/222* (2013.01); *G11C 11/4076* (2013.01); *G11C 11/4096* (2013.01)

(58) Field of Classification Search
CPC ................................ G11C 7/222; G11C 7/106
USPC .......................................... 365/193, 189.05
See application file for complete search history.

(56) References Cited

U.S. PATENT DOCUMENTS

| | | | | |
|---|---|---|---|---|
| 4,484,273 | A * | 11/1984 | Stiffler | G06F 13/28 710/110 |
| 5,392,450 | A * | 2/1995 | Nossen | H04B 7/2123 342/352 |
| 5,459,846 | A * | 10/1995 | Hyatt | B60R 16/0373 711/167 |
| 5,489,901 | A * | 2/1996 | Fukuda | G06F 7/768 341/50 |
| 5,809,306 | A * | 9/1998 | Suzuki | G06F 8/423 712/E9.017 |
| 6,031,847 | A * | 2/2000 | Collins | H04L 7/10 370/508 |
| 6,192,092 | B1 | 2/2001 | Dizon | |

(Continued)

OTHER PUBLICATIONS

Yong-Cheol Bae, Joon-Young Park et al; A 1.2V 30nm 1.6Gb/s/pin 4Gb LPDDR3 SDRAM with Input Skew Calibration and Enhanced Control Scheme; ISSCC Dig. Tech. Papers: Feb. 2012, pp. 44-46.

(Continued)

*Primary Examiner* — Michael Tran
(74) *Attorney, Agent, or Firm* — McDermott Will & Emery LLP

(57) ABSTRACT

A method for minimizing skew in a High Bandwidth Memory (HBM) device is provided. The method includes grouping a plurality of information bits of the HBM device into at least two groups of information bits, wherein the plurality of information bits includes a plurality of data bits and a plurality of control bits, and the plurality of information bits are grouped such that each group of the at least two groups includes at least one control bit and the at least two groups form a byte of data. The method further includes delaying the plurality of information bits of each group of the at least two groups during a data transfer operation to minimize the skew between the at least two groups of information bits.

20 Claims, 5 Drawing Sheets

(56) References Cited

U.S. PATENT DOCUMENTS

| | | | |
|---|---|---|---|
| 6,275,555 B1 | 8/2001 | Song | |
| 6,316,980 B1 | 11/2001 | Vogt | |
| 6,442,102 B1 | 8/2002 | Borkenhagen | |
| 7,167,476 B1* | 1/2007 | Kritayakirana | H04J 3/1617 370/394 |
| 7,401,246 B2 | 7/2008 | Martin | |
| 7,556,132 B2 | 7/2009 | Carneval | |
| 7,594,750 B2 | 9/2009 | Lee | |
| 7,712,006 B1* | 5/2010 | Miller | G06F 13/4273 714/750 |
| 2002/0004865 A1* | 1/2002 | Barth | G06F 13/161 710/100 |
| 2005/0166033 A1* | 7/2005 | Jacob | G06F 15/8007 712/11 |
| 2006/0072619 A1* | 4/2006 | Geer | G06F 13/4282 370/476 |
| 2007/0233942 A1 | 10/2007 | Huang | |
| 2009/0086768 A1* | 4/2009 | Fairbanks | H04J 3/047 370/545 |
| 2012/0044003 A1* | 2/2012 | Itou | H03L 7/0805 327/160 |
| 2012/0057572 A1* | 3/2012 | Evans | H04W 88/085 370/338 |
| 2015/0100713 A1* | 4/2015 | Sengoku | G06F 13/4291 710/110 |
| 2015/0127867 A1* | 5/2015 | Takahashi | G06F 13/24 710/269 |
| 2015/0212880 A1* | 7/2015 | Carissimi | G06F 11/1048 714/764 |
| 2015/0312476 A1* | 10/2015 | Wakabayashi | H04N 1/41 348/231.99 |
| 2015/0363107 A1* | 12/2015 | Best | G11O 5/04 711/105 |
| 2016/0013885 A1* | 1/2016 | Wood | H04L 1/004 370/235 |
| 2016/0079936 A1* | 3/2016 | Hutchins | H03G 3/3084 250/214 A |

OTHER PUBLICATIONS

Munkyo Seo, Sopan Joshi, Ian A. Young; A Blind Calibration Technique to Correct Memory Errors in Amplifier-sharing Pipelined ADCs; IEEE International Symposium on Circuit and Systems: 2007.

Devendra Rai, Lothar Thiele; A Calibration Based Thermal Modeling Technique for Complex Multicore Systems: Design, Automation & Test in Europe Conference & Exhibition; Mar. 2015; pp. 1138-1143.

Ho Joon Lee, Yong-Bin Kim; A Process Tolerant Semi-Self Impedance Calibration Method for LPDDR4 Memory Controller; IEEE 58th International Midwest Symposium on Circuit and Sytems (MWSCAS), Aug. 2015; pp. 1-4.

Won-Ok Kwon et al; PCI Express Multi-lane De-skew logic design using embedded SERDES FPGA: Solid-State and Integrated Circuits Technology; Proceedings. 7th International Conference on, vol. 3; Oct. 2004; pp. 2035-2038.

Hu Xu et al: Skew Variability in 3-D ICs with Multiple Clock Domains, 2011 IEEE International Symposium of Circuits and Systems (ISCAS); May 2011; pp. 2221-2224.

Shih-Hsu Huang et al; Utilizing Clock Skew for Timing Reliability Improvement, TENCON 2007—2007 IEEE Region 10 Conference: Nov. 2007: pp. 1-4.

\* cited by examiner

PER-GROUP DELAY LINE ARCHITECTURE TO DE-SKEW INPUT/OUTPUT TIMING BETWEEN A HIGH BANDWIDTH MEMORY (HBM) PHYSICAL (PHY) INTERFACE AND THE HBM DEVICE

TECHNICAL FIELD

The present disclosure generally relates to a delay line architecture used in computer memory devices and more specifically to a per-group delay line architecture to de-skew I/O timing requirements between a High Bandwidth Memory (HBM) Physical (PHY) interface and the HBM device.

BACKGROUND

When a computer system interfaces with a Double Data Rate (DDR) Synchronous Dynamic Random-Access (SDRAM) memory, a DDR controller typically manages the flow of data between the host device for the DDR controller and the DDR memory device(s). The DDR protocol specifies the transfer (read/write) of data on both the rising and falling edges of the data bus strobe (typically referred to as DQS) signals. The DDR controller typically interfaces with the DDR memory device using a Physical (PHY) interface that converts digital signals and commands from the DDR controller logic into waveforms (signals) that the DDR memory can interpret.

In order for reliable data transfer, the read/write operations in DDR SDRAM devices have to adhere to strict setup and hold time requirements. However, as the operating frequency of the DDR SDRAM device increases, the setup/hold timing requirements become more difficult to meet due to the data line skew.

The description provided in the background section should not be assumed to be prior art merely because it is mentioned in or associated with the background section. The background section may include information that describes one or more aspects of the subject technology.

SUMMARY

In certain aspects, a method for minimizing skew in a High Bandwidth Memory (HBM) device includes grouping a plurality of information bits of the HBM device into at least two groups of information bits. The plurality of information bits includes a plurality of data bits and a plurality of control bits. The plurality of information bits are grouped such that each group of the at least two groups includes at least one control bit and the at least two groups form a byte of data. The method also includes delaying the plurality of information bits of each group of the at least two groups during a data transfer operation to minimize the skew between the at least two groups of information bits.

In certain aspects, a system is described that includes a High Bandwidth Memory (HBM) controller, a HBM device, and a physical interface for interfacing the HBM controller with the HBM memory device to transfer a plurality of information bits between the HBM controller and the HBM memory device. The plurality of information bits includes a plurality of data bits and a plurality of control bits. The plurality of information bits are grouped into at least two groups of information bits such that each group of the at least two groups includes at least four data bits and at least one control bit and the at least two groups form a byte of data. Further, the physical interface delays the plurality of information bits of each group during a data transfer operation to minimize a skew between the at least two groups of information bits.

In certain aspects, a method for minimizing skew in a High Bandwidth Memory (HBM) device includes grouping a plurality of information bits of the HBM device into 8 groups of information bits. The plurality of information bits includes 32 data bits and 8 control bits, which include 4 data mask (DM) bits and 4 data bus inversion (DBI) bits. Each group of information bits includes 4 data bits and 1 control bit. Further, the 8 groups of information bits form 4 bytes of data. Each byte formed uses 2 groups of data bits, and is associated with 1 DM bit and 1 DBI bit. The method also includes delaying each group of information bits during a data transfer operation to minimize the skew between the 8 groups of information bits.

In certain aspects, a system is described that includes a High Bandwidth Memory (HBM) device; a means for controlling the HBM device, and a means for interfacing the HBM device with the means for controlling the HBM device to transfer a plurality of information bits between the HBM device and the means for controlling the HBM device. The plurality of information bits includes a plurality of data bits and a plurality of control bits. The plurality of information bits are grouped into at least two groups of information bits such that each group of the at least two groups includes at least one control bit and the at least two groups form a byte of data. The means for interfacing the HBM device also delays the plurality of information bits of each group during a data transfer operation to minimize a skew between the at least two groups of information bits.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

Figure 1:
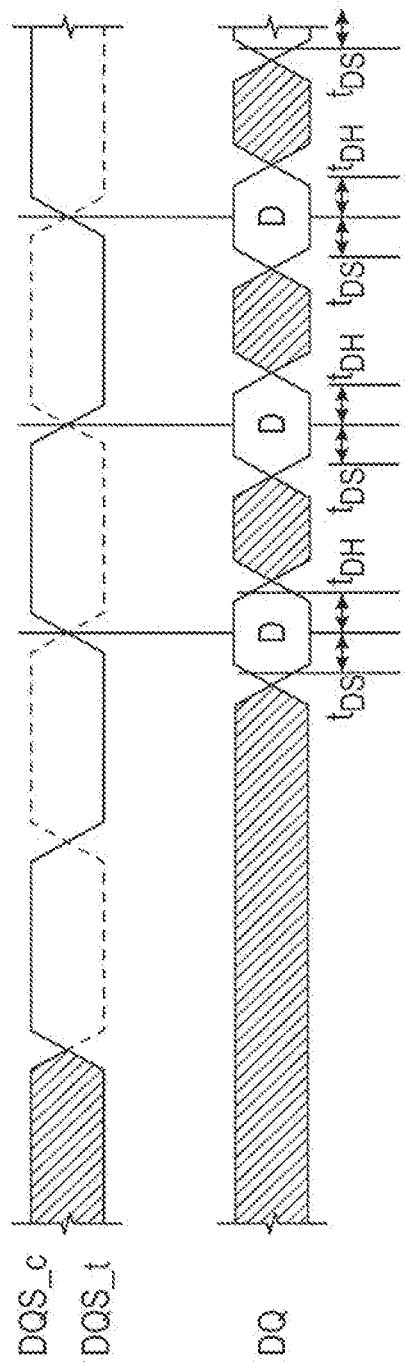
FIG. 1 illustrates a sample timing diagram indicating the setup and hold time requirements during a data transfer operation in double data rate (DDR) synchronous dynamic random-access memory (SDRAM) device.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Systems and methods described herein are generally related to the field of electronic circuits, and, more specifically, to system and methods for minimizing skew in High Bandwidth Memory (HBM) devices to satisfy setup/hold time requirements.

The disclosed system and methods address a deficiency tied to computer technology and arising in the realm of computer architecture, namely, the increase in the area occupied and the power consumed when implementing a per-bit de-skew architecture to minimize skew in an HBM based system for satisfying the setup/hold time requirements. The disclosed systems and methods overcome this deficiency by grouping data and control bits transferred during memory read/write operations in the HBM based system and using a per-group delay line architecture to minimize skew between groups of data and control bits.

Double data rate (DDR) synchronous dynamic random-access memory (SDRAM) is a class of computer memory. Different standards of the DDR SDRAM are defined by JEDEC (Joint Electron Device Engineering Council) Solid State Technology Association based on the operational clock frequency of the memory devices. The DDR SDRAM standards in increasing order of clock frequencies generally include DDR1, DDR2, DDR3, and DDR4. Mobile DDR (also known as mDDR, Low Power DDR, or LPDDR) is a type of DDR SDRAM for mobile computers. The different standards for the LPDDR devices based on the operational clock frequencies generally include LPDDR1, LPDDR2, LPDDR3, and LPDDR4.

Typically, digital delay line based de-skew architecture is used in DDR physical (PHY) interface to support data transfers in the high-speed DDR SDRAM standards, such as DDR3, DDR4, LPDDR3 and LPDDR4. In a typical DDR SDRAM setup, the DDR memory controller interfaces with the DDR SDRAM device using a Physical (PHY) interface that converts digital signals and commands from the DDR memory controller logic into waveforms that the DDR SDRAM memory device can interpret.

As is known, in the DDR SDRAM, two data words are transferred per clock cycle at the input/output (I/O) pins. The DDR SDRAM architecture employs a 2n-prefetch architecture, where the internal data bus is twice the width of the external bus. During data transfer, a bidirectional data strobe (DQS) is transmitted along with data in order to control data capture at the receiver during read and write operations.

FIG. 1 illustrates an example timing diagram indicating the setup and hold time requirements during a data transfer operation in DDR SDRAM device. Herein, the bidirectional data strobe (DQS) is indicated as a differential signal including levels DQS_t and DQS_c. During a WRITE operation, the DDR SDRAM device is the receiver. As illustrated, the data DQ must be applied to the data pins of the DDR SDRAM device at a time tDs prior to the associated edge of the DQS and held valid until time $t_{DH}$ after the associated edge of the DQS. During a READ operation, the DDR SDRAM PHY (or the DDR memory controller) is the receiver, and the DDR SDRAM device outputs data DQ which is edge-aligned with DQS. In order to guarantee the setup/hold time requirements during the READ operation, the DQS is shifted such that it transitions (between levels DQS_t and DQS_c) around the center of input data DQ.

Due to the increased clock frequency of the DDR3/DDR4/LPDDR3/LPDDR4 standards, the setup/hold timing requirements become more difficult to meet due to the skew between individual signal lines. In order to minimize the skew and meet setup/hold time requirements, a per-bit delay line based de-skew architecture is employed in the high speed DDR SDRAM device based system.

Figure 2:
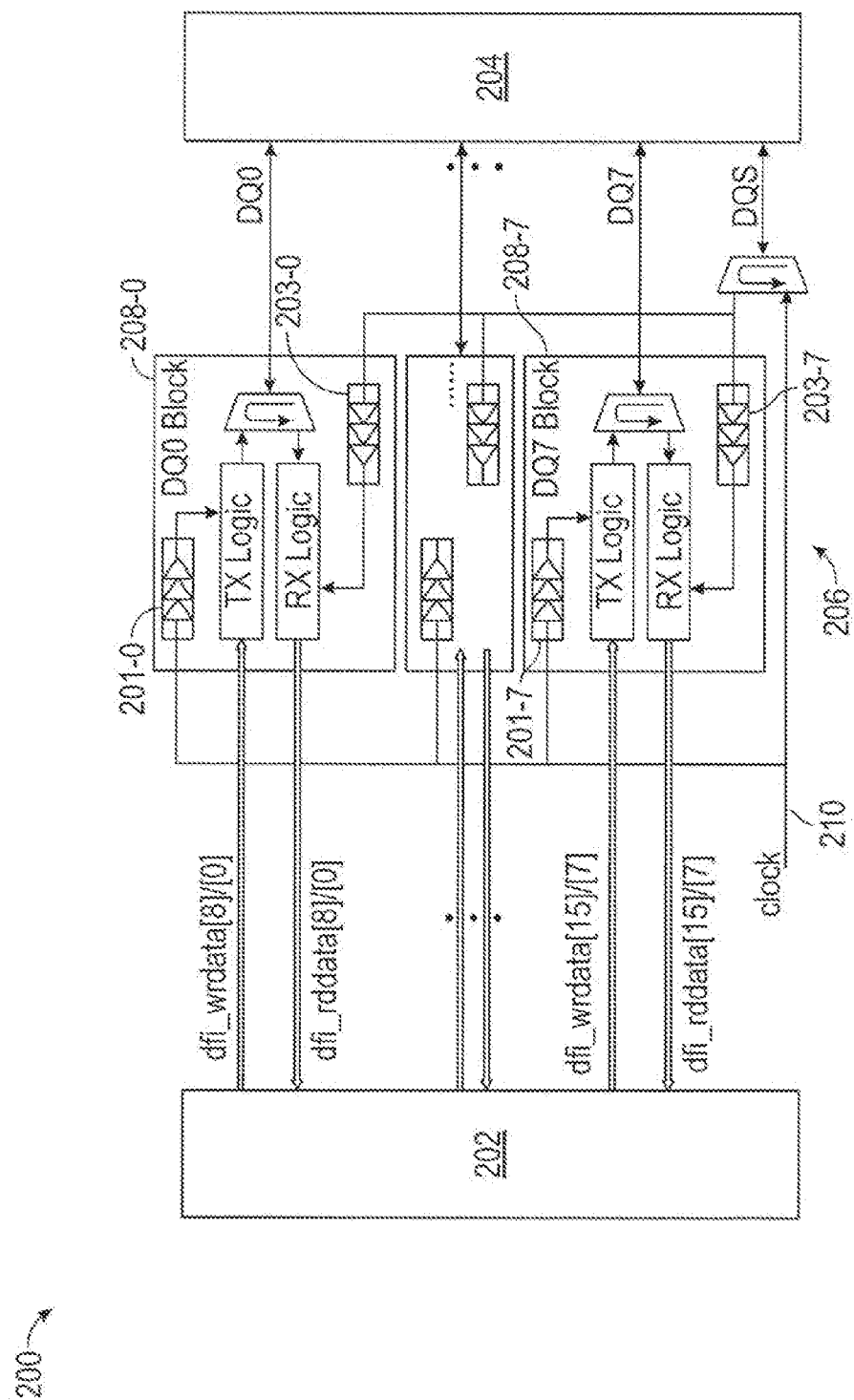
FIG. 2 illustrates a sample per-data-bit delay line based de-skew architecture used in high-speed DDR SDRAM devices based system.

FIG. 2 illustrates a sample per-bit delay line based de-skew architecture 200 used in high-speed DDR SDRAM device based system. As illustrated, a DDR PHY Interface (abbreviated as "DFI") 206 interfaces a DDR controller 202 with a DDR memory device 204. The DFI is a protocol that defines the signals, timing parameters, programmable parameters, and other control signals/parameters for exchanging control information and data between the DDR controller 202 with the DDR memory device 204 via the DFI 206.

The DFI 206 includes 8 transceiver (TX/RX) blocks 208-0-208-7 for exchanging data DQ and control information DQS between the DDR controller 202 with the DDR memory device 204. The data being written to the DDR memory device 204 via the DFI 206 is represented by signals dfi_wrdata [8]/[0]-dfi_wrdata[15]/[7] and the data being read from the DDR memory device 204 via the DFI 206 is represented by signals dfi_rddata [8]/[0]-dfi_rddata1 [15]/[7].

Each TX/RX block 208-0-208-7 includes a corresponding delay line 201-0-201-7 for delaying a clock signal 210 and a corresponding delay line 203-0-203-7 for delaying the DQS. The clock signal 210 is delayed such that the data DQ is center-aligned when the DQS transitions, thereby compensating for the skew between data bits DQ0-DQ7 during a write operation. The input DQS is delayed in order to shift DQS and compensate for the skew between data bits DQ0-DQ7 during a read operation.

As opposed to a DDR SDRAM based system, in an HBM based system, the DQS is composed of two differential strobes, a write data strobe (WDQS) for WRITE operations and a read data strobe (RDQS) for READ operations. Like the DDR SDRAM devices, the HBM devices also use a double-data-rate architecture for transferring information on both the rising and falling edges of the differential strobes WDQS and RDQS. During data transfer operations in an HBM based system, each pair of RDQS/WDQS is transmitted along with 40 information bits including 32 Data bits (DQ) and 8 control bits that include 4 Data Mask bits (DM) and 4 Data Bus Inversion (DBI) bits. The number of information bits (40, in the case of HBM) is 4 times greater than the information bits transferred per DQS in the DDR3/

DDR4/LPDDR3/LPDDR4 memory devices. Also, HBM device may operate at a frequency of around 1 GHz, and thereby provide 2 GHz data rates, which are around the same as the data rates provided by the DDR3/LPDDR3 memory devices.

Given the high operational speeds, there may be a skew between individual information bits (or, more specifically, between the individual signal lines of the 40 information bits) in the HBM. The skew may be minimized using the digital delay line based de-skew architecture of FIG. 2. However, the per-bit de-skew architecture in an HBM device based system would require four times the number of logic gates and related control logic than a DDR SDRAM based system. Thus, the area required and the power consumed by the HBM based system will increase.

Figure 3:
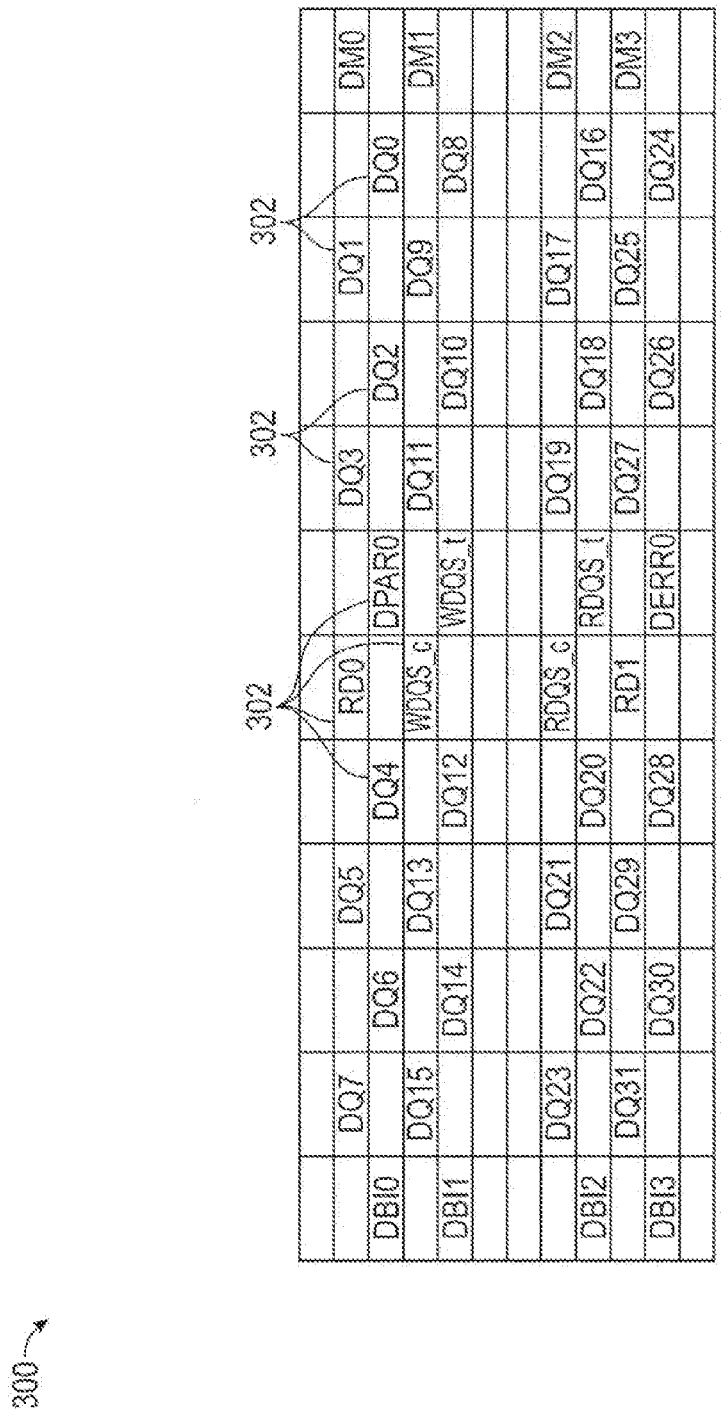
FIG. 3 schematically illustrates a bottom plan view of a bump matrix of a typical High Bandwidth Memory (HBM) device package.

FIG. 3 schematically illustrates a bottom plan view of a bump matrix 300 of a typical HBM device package. As illustrated, the bump matrix 300 includes an array of the connection pads 302 on the HBM device package including a connection pad 302 for each information bit of the 40 information bits. In an example, the connection pads 302 may be solder balls or other connection means that provide electrical contact between the device package and the printed circuit board on which the HBM device is mounted. The configuration (e.g., the placement, layout, distance between adjacent connection pads, and the like) of the bump matrix 300 is defined by the HBM protocol.

The connection pads 302 of the bump matrix 300 include 32 connection pads 302 for the 32 data bits (DQ) and indicated by DQ0-DQ31, 4 connection pads 302 for 4 data mask bits and indicated by DM0-DM3, and 4 connection pads for the Data Bus Inversion (DBI) bits and indicated by DBI0-DBI3. The bump matrix 300 also includes connection pads 302 for the write data strobe (WDQS) and a read data strobe (RDQS) signals, illustrated as connection pads WDQS_c, WDQS_t, RDQS_c, and RDQS_t. Also illustrated are redundant connection pads 302 labelled as RD0-RD1, a connection pad 302 for a data parity bit labelled as DPAR0, and a connection pad for a data error bit labelled as DERR0.

Generally, during operation, the skew between signals corresponding to adjacent information bits in the HBM device package is relatively negligible. As discussed further below, in order to minimize the skew in an HBM based system, the 40 information bits (32 DQ bits, 4 DM bits, and 4 DBI bits) may be grouped into eight different groups of information bits and each group is provided with an individual delay line. The delay line for each group is chosen such that the skew between the different groups of information bits is less than about 25% of the operating frequency of the HBM memory, and all groups share a delay line in their respective WRITE/READ paths of about 75% of the operating frequency of the HBM memory.

Figure 4:
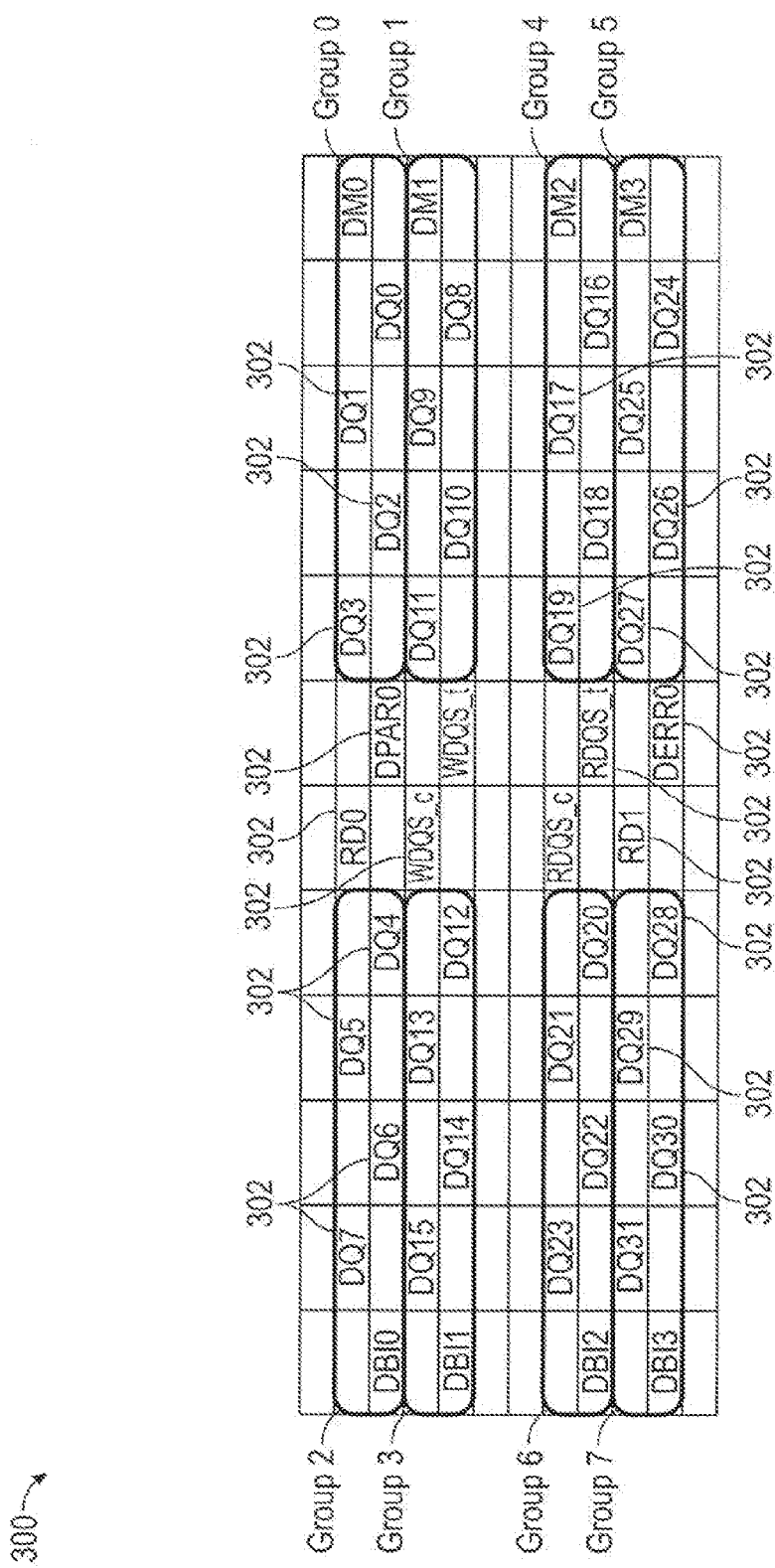
FIG. 4 illustrates different groups of information bits transferred during memory read/write operations in a HBM device based system, according to one or more embodiments disclosed.

FIG. 4 illustrates the different groups GROUP0-GROUP7, according to one or more embodiments disclosed. Table I below lists the mapping of the information bit and the corresponding groups.

| Information Bit Groups | HBM Connection Pads |
| --- | --- |
| Group 0 | DQ3~DQ0 and DM0 |
| Group 1 | DQ11~DQ8 and DM1 |
| Group 2 | DBI0 and DQ7~DQ4 |
| Group 3 | DBI1 and DQ15~DQ12 |
| Group 4 | DQ19~DQ16 and DM2 |
| Group 5 | DQ27~DQ24 and DM3 |
| Group 6 | DBI2 and DQ23~DQ20 |
| Group 7 | DBI3 and DQ31~DQ28 |

The groups GROUP0-GROUP7 are formed such that two groups that form a byte of data DQ include one data mask (DM) bit and one Data Bus Inversion (DBI) bit. Thus, as illustrated in FIG. 4, GROUP0 and GROUP2 forming 1 byte of data including data bits DQ0-DQ7 include 1 Data Mask bit DM0 and 1 Data Bus Inversion DBI0. Similarly, GROUP1 and GROUP3 forming the next byte of data including data bits DQ8-DQ15 include 1 Data Mask bit DM1 and 1 Data Bus Inversion DBI1.

As mentioned above, the HBM memory device is mounted on a printed circuit board (PCB), and the electrical conductors of the PCB provide electrical connection to each connection pad 302 (FIG. 3). The grouping of the information bits may be achieved by collectively accessing (e.g., addressing, controlling, referencing, or the like) the electrical conductors corresponding to the information bits of each group. Thus, it may not be required for the connection pads 302 belonging to a group to be located adjacent each other, as illustrated in FIG. 4. By collectively accessing the electrical conductors corresponding to the information bits of a group, the desired grouping of information bits may be achieved. As a result, de-skewing techniques according to embodiments disclosed can be applied to a variety of HBM device packages having different layouts of connection pads.

Figure 5:
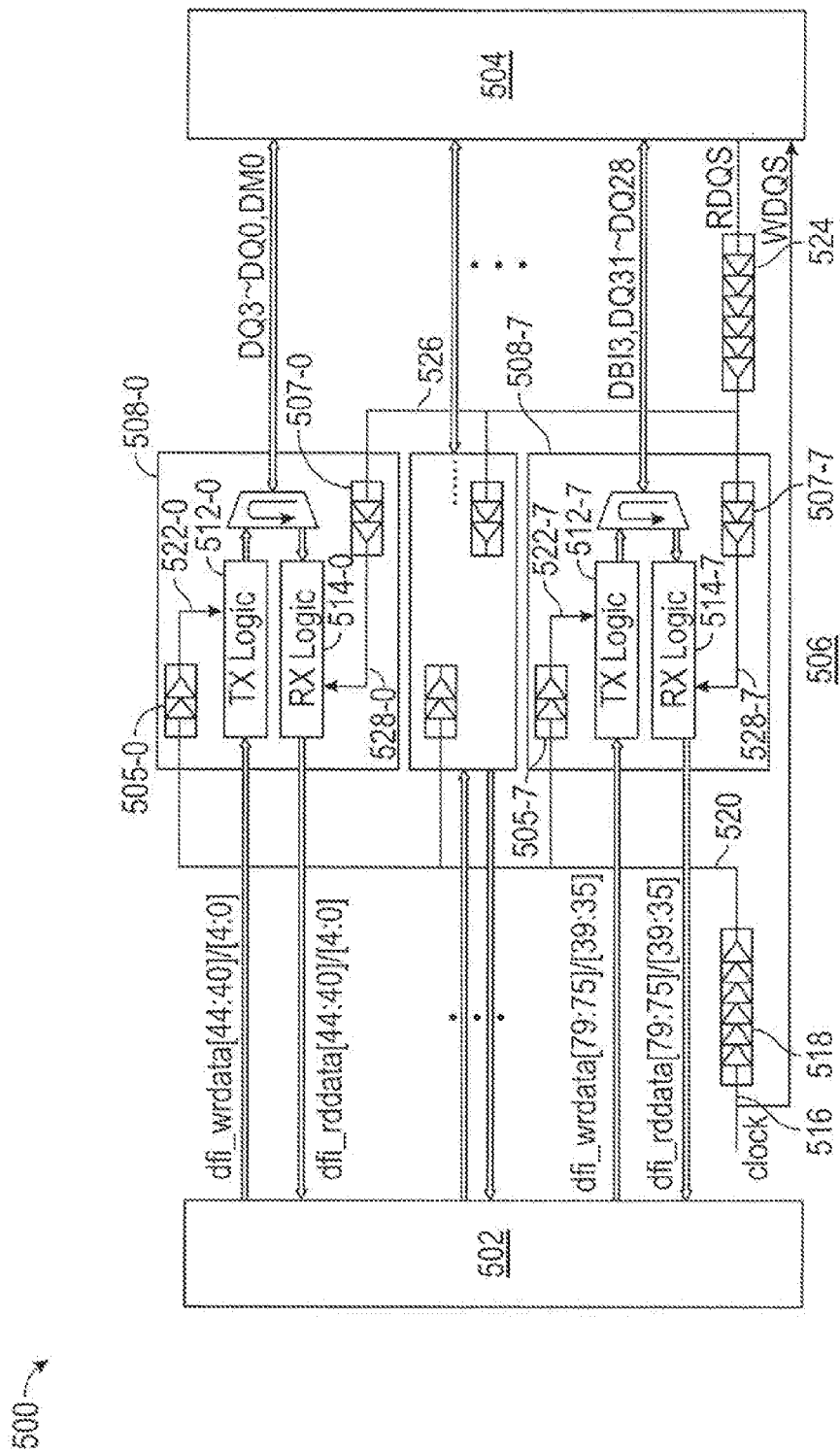
FIG. 5 illustrates example per-group delay line architecture for use in an HBM device based system, according to one or more embodiments disclosed.

FIG. 5 illustrates example per-group delay line architecture 500 for use in an HBM device based system, according to one or more embodiments disclosed. As illustrated, the per-group delay line architecture 500 includes an HBM controller 502 interfacing with an HBM memory device 504 via the DFI 506 that converts digital signals and commands from the HBM controller 502 into waveforms (signals) that the HBM memory device 504 can interpret.

As illustrated, the DFI 506 includes 8 transceiver (TX/RX) blocks 508-0-508-7 for exchanging data DQ and control information DM and DBI between the HBM controller 502 and the HBM memory device 504.

The data DQ and control information DM, DBI being written to the HBM memory device 504 via the DFI 506 is represented by signals dfi_wrdata [44:40]/[4:0]-dfi_wrdata [79:75]/[39:35] and the data being read from the HBM memory device 504 via the DFI 506 is represented by signals dfi_rddata [44:40]/[4:0]-dfi_rddata[79:75]/[39:35]. As mentioned above, 40 information bits (32 DQ bits and 8 control bits-4 DM bits and 4 DBI bits) are transferred along with each pair of RDQS/WDQS signals. These information bits are represented as DQ0-DQ31, DM0-DM3, and DBI0-DBI3 that are transferred between the HBM memory device 504 and the DFI 506.

Each TX/RX block 508-0-508-7 corresponds to a group GROUP0-GROUP7 (FIG. 4) and includes corresponding TX Logic blocks 512-0-512-7 and RX Logic blocks 514-0-514-7. Each TX/RX block 508-0-508-7 further includes corresponding write delay lines 505-0-505-7 and read delay lines 507-0-507-7.

As illustrated, a clock signal 516 is delayed using a write base delay line 518 to obtain a first delayed clock signal 520 that is provided to each TX/RX block 508-0-508-7. The first delayed clock signal 520 is further delayed using the corresponding write delay lines 505-0-505-7 to obtain corresponding second delayed clock signals 522-0-522-7. The second delayed clock signals 522-0-522-7 are provided to corresponding TX Logic blocks 512-0-512-7 to control the data DQ being written in the HBM memory device 504.

The read data strobe (RDQS), which is used during READ operations, is delayed using a read base delay line 524 to obtain a first delayed read data strobe 526. Each TX/RX block 508-0-508-7 receives the first delayed read data strobe 526 and further delays it using the corresponding read delay lines 507-0-507-7 to obtain corresponding second delayed read data strobes 528-0-528-7. The second delayed read data strobes 528-0-528-7 are provided to the corresponding RX Logic blocks 514-0-514-7 to control the data DQ being read from the HBM memory device 504. The clock signal 516 is provided as the write data strobe (WDQS) for use during WRITE operations.

The write base delay line 518 provides about 75% of the total required delay and each write delay line 505-0-505-7 provides the remaining delay of about 25%. This is in contrast to the full delay lines in the per-bit delay line architecture of FIG. 2, wherein each full delay line 201-0-201-7 provides about 100% of the required delay. The read base delay line 524 similarly provides a delay of about 75% of the total required delay and each read delay line 507-0-507-7 provides the remaining delay of about 25%. The amount (percentage) of delay provided by the delay lines 518 and 505-0-505-7 is based on the operational clock frequency of the HBM device, and the delay provided by the delay lines 524 and 507-0-507-7 is based on the read data strobe (RDQS).

During a WRITE operation, the write delay lines 505-0-505-7 control the generation of information bits of the corresponding groups GROUP0-GROUP7. For instance, the write delay line 505-0 controls the generation of the information bits DM0 and DQ0-DQ3 of the group GROUP0 from the TX/RX block 508-0, the write delay line 505-1 controls the generation of the information bits DM1 and DQ8-DQ11 of the group GROUP1 from the TX/RX block 508-1, and so on.

During a READ operation, the read delay lines 507-0-507-7 control the receipt of the information bits of the corresponding groups GROUP0-GROUP7. For instance, read delay line 507-0 controls the receipt of information bits DM0 and DQ0-DQ3 of the group GROUP0 from HBM memory device 504 into the TX/RX block 508-0, the write delay line 505-1 controls the receipt of the information bits DM1 and DQ8-DQ11 of the group GROUP1 from the HBM memory device 504 into the TX/RX block 508-1, and so on.

The per-group delay line architecture 500, according to embodiments disclosed, may shorten the read/write skew and, as a result, the time for which the data DQ is valid during read/write operations may substantially increase. The per-group delay line architecture 500 provides these advantages using a relatively small area and reduced power consumption. Compared to a per-bit delay line architecture, the per-group delay line architecture 500 may reduce the number of digital delay lines required by about 80%. This is because, if the per-bit delay line architecture of FIG. 2 were implemented, then 80 full delay lines (40 for write bits and 40 for read bits) would be required. However, the per-group delay line architecture 500 requires only 18 delay lines-8 write delay lines 505-0-505-7 for each TX/RX block 508, 8 read delay lines 507-0-507-7 for each TX % RX block 508, 1 write base delay line 518, and 1 base delay line 524. Thus, the number of digital delay lines is reduced by 77.5% ((80−18)/80), which, rounded up, is about 80%. The per-group delay line architecture 500 also reduces the area required for the digital delay lines by about 90%. This is because the area occupied by the 18 delay lines in the per-group delay line architecture 500 is around the area occupied by 5.5 full delay lines (2*75%+16*25%). Thus, the area occupied by the delay lines the per-group delay line architecture 500 is reduced by about 93.1% ((80−5.5)/80), which, rounded down, is about 90%.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. §112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A method for minimizing skew in a High Bandwidth Memory (HBM) device, comprising:
    grouping a plurality of information bits of the HBM device into at least two groups of information bits, wherein the plurality of information bits includes a plurality of data bits and a plurality of control bits, and the plurality of information bits are grouped such that each group of the at least two groups includes at least one control bit and the at least two groups form a byte of data; and
    delaying the plurality of information bits of each group of the at least two groups during a data transfer operation to minimize the skew between the at least two groups of information bits.

2. The method of claim 1, wherein delaying the plurality of information bits of each group comprises at least one of:
    delaying the information bits of each group of the at least two groups during a memory write operation using a write base delay line;
    delaying the information bits of each group of the at least two groups during a memory read operation using a read base delay line;
    delaying the information bits of a first group of the at least two groups during the memory write operation using a first write delay line;
    delaying the information bits of a second group of the at least two groups during the memory write operation using a second write delay line;
    delaying the information bits of the first group of the at least two groups during the memory read operation using a first read delay line; and
    delaying the information bits of the second group of the at least two groups during the memory read operation using a second read delay line.

3. The method of claim 2, wherein each of the first write delay line and the second write delay line are derived from the write base delay line and a delay provided by the first write delay line and the second write delay line is less than a delay provided by the write base delay line.

4. The method of claim 3, wherein the delay provided by each of the first write delay line, the second write delay line, and the write base delay line is based on an operating frequency of the HBM device.

5. The method of claim 2, wherein each of the first read delay line and the second read delay line are derived from the read base delay line and a delay provided by the first read delay line and the second read delay line is less than a delay provided by the read base delay line.

6. The method of claim 5, wherein the delay provided by each of the first read delay line, the second read delay line, and the read base delay line is based on the read data strobe of the HBM device.

7. The method of claim 1, wherein the plurality of control bits includes at least one data mask bit and at least one data bus inversion bit, and one of the at least two groups forming the byte of data includes the at least one data mask bit and the other of the at least two groups forming the byte of data includes the at least one data bus inversion bit.

8. The method of claim 1, further comprising:
    grouping the plurality of information bits into at least eight groups of information bits, wherein each group of the at least eight groups of information bits includes the at least one control bit.

9. The method of claim 8, wherein the at least eight groups of information bits form at least four bytes of data and each byte of data of the at least four bytes of data is associated with at least two control bits.

10. A system, comprising:
    a High Bandwidth Memory (HBM) controller;
    a High Bandwidth Memory (HBM) device; and
    a physical interface for interfacing the HBM controller with the HBM memory device to transfer a plurality of information bits between the HBM controller and the HBM memory device, wherein
        the plurality of information bits includes a plurality of data bits and a plurality of control bits, and the plurality of information bits are grouped into at least two groups of information bits such that each group of the at least two groups includes at least four data bits and at least one control bit and the at least two groups form a byte of data; and the physical interface configured to delay the plurality of information bits of each group during a data transfer operation to minimize a skew between the at least two groups of information bits.

11. The system of claim 10, wherein the physical interface is further configured to at least one of:

delay the information bits of each group of the at least two groups during a memory write operation using a write base delay line;

delay the information bits of each group of the at least two groups during a memory read operation using a read base delay line;

delay the information bits of a first group of the at least two groups during the memory write operation using a first write delay line;

delay the information bits of a second group of the at least two groups during the memory write operation using a second write delay line;

delay the information bits of the first group of the at least two groups during the memory read operation using a first read delay line; and delay the information bits of the second group of the at least two groups during the memory read operation using a second read delay line.

12. The system of claim 11, wherein each of the first write delay line and the second write delay line are derived from the write base delay line and a delay provided by the first write delay line and the second write delay line is less than a delay provided by the write base delay line.

13. The system of claim 12, wherein the delay provided by each of the first write delay line, the second write delay line, and the write base delay line is based on an operating frequency of the HBM device.

14. The system of claim 11, wherein each of the first read delay line and the second read delay line are derived from the read base delay line and a delay provided by the first read delay line and the second read delay line is less than a delay provided by the read base delay line.

15. The system of claim 14, wherein the delay provided by each of the first read delay line, the second read delay line, and the read base delay line is based on the read data strobe of the HBM device.

16. The system of claim 10, wherein the plurality of control bits includes at least one data mask bit and at least one data bus inversion bit, and one of the at least two groups forming the byte of data includes the at least one data mask bit and the other of the at least two groups forming the byte of data includes the at least one data bus inversion bit.

17. The system of claim 10, wherein the plurality of information bits are grouped into at least eight groups of information bits, wherein each group of the at least eight groups includes the at least one control bit.

18. The system of claim 17, wherein the at least eight groups of information bits form at least four bytes of data and each byte of data of the at least four bytes of data is associated with at least two control bits.

19. A method for minimizing skew in a High Bandwidth Memory (HBM) device, comprising:

grouping a plurality of information bits of the HBM device into 8 groups of information bits, wherein the plurality of information bits includes 32 data bits and 8 control bits including 4 data mask (DM) bits and 4 data bus inversion (DBI) bits, each group of information bits including 4 data bits and 1 control bit, the 8 groups of information bits forming 4 bytes of data, each byte formed using 2 groups of data bits, and each byte of data is associated with 1 DM bit and 1 DBI bit; and delaying each group of information bits during a data transfer operation to minimize the skew between the 8 groups of information bits.

20. The method of claim 19, wherein delaying each group of information bits comprises at least one of:

delaying each group of information bits during a memory write operation using a write base delay line;

delaying each group of information bits during a memory read operation using a read base delay line;

delaying each individual group of information bits during the memory write operation using a respective write delay line; and delaying each individual group of information bits during the memory read operation using a respective read delay line, wherein each write delay line is based on the write base delay line, a delay provided by each write delay line is less than a delay provided by the write base delay line, each read delay line is based on the read base delay line, and a delay provided by each read delay line is less than a delay provided by the read base delay line.

* * * * *